United States Patent [19]
Mistry

[11] Patent Number: 5,404,068
[45] Date of Patent: Apr. 4, 1995

[54] PIEZOELECTRIC DEVICE

[75] Inventor: Pratapkumar N. Mistry, Hemel Hempstead, United Kingdom

[73] Assignee: Dowty Maritime Limited, Middlesex, United Kingdom

[21] Appl. No.: 57,413

[22] Filed: May 6, 1993

[30] Foreign Application Priority Data

May 6, 1992 [GB] United Kingdom .................. 9209733

[51] Int. Cl.$^6$ ........................................... H01L 41/08
[52] U.S. Cl. ................................. 310/363; 310/337; 310/365; 310/369
[58] Field of Search ............... 310/363, 364, 354–356, 310/369, 345, 337

[56] References Cited

U.S. PATENT DOCUMENTS

| | | | |
|---|---|---|---|
| 2,150,328 | 3/1939 | Keall et al. | 310/345 X |
| 2,260,842 | 10/1941 | Schwarzhaupt | 310/363 X |
| 2,945,208 | 7/1960 | Samsel | 310/337 X |
| 3,068,446 | 12/1962 | Ehrlich et al. | 310/337 X |
| 3,142,035 | 7/1964 | Harris | 310/363 X |
| 3,313,962 | 4/1967 | Sonderegger | 310/363 X |
| 4,524,295 | 6/1985 | Allensworth et al. | 310/345 X |
| 5,199,004 | 3/1993 | Monahan | 310/337 X |

*Primary Examiner*—Mark O. Budd
*Attorney, Agent, or Firm*—Young & Thompson

[57] ABSTRACT

A piezoelectric device has a piezoelectric element (2) with an electrically conductive surface and an electrical terminal (1) spaced from that surface with a reesilient, compressible mass of electrically conductive material (9) held captive between the terminal (1) and that surface to form an electrical connection therebetween. Typically, the electrically conductive material (9) comprises filaments, such as brass wire wool, having at least a conductive surface layer and which are resilient in bending so that when compressed they tend to expand and maintain continuous physical and electrical contact with the adjacent restraining surfaces. The low inertia of the resilient filaments and their multiple contact with the adjacent surfaces helps provide the required continuous contact. Thus, the use of a conventional soldered connection to the piezoelectric element and the associated stress related mechanical failure problems or physical access problems are avoided.

6 Claims, 1 Drawing Sheet

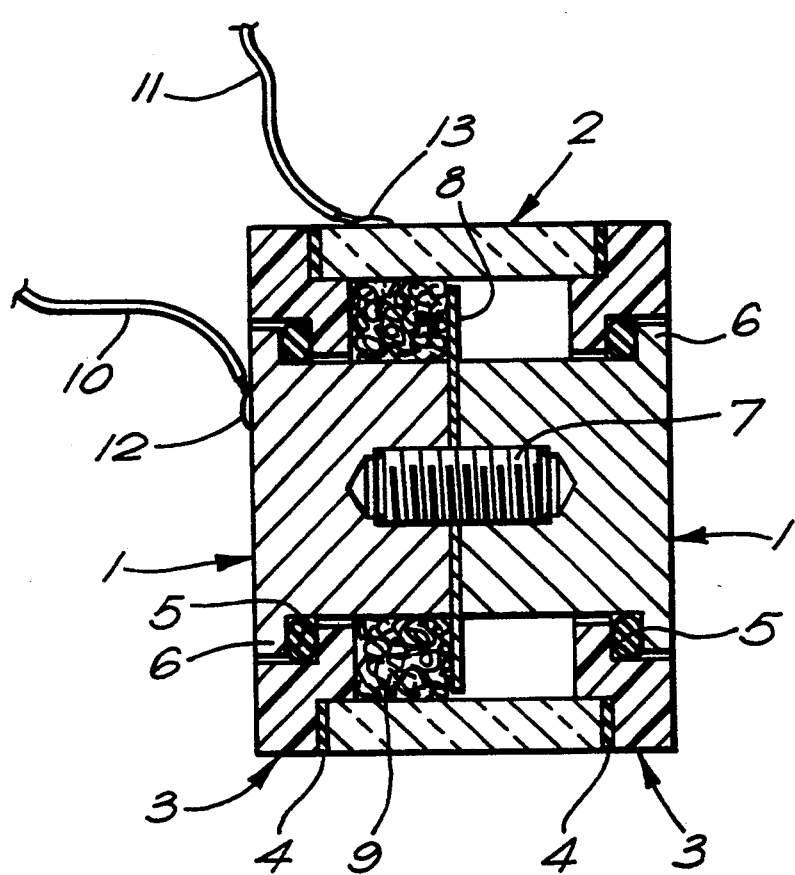

PIEZOELECTRIC DEVICE

TECHNICAL FIELD

This invention relates to piezoelectric devices, especially vibrators which incorporate a piezoelectric element to convert an alternating electrical input signal to a mechanical output vibration, typically to generate sound waves in seawater.

The standard method of making an electrical connection to a piezoelectric element is to solder a wire to a silvered surface of the element. However, in the case of a vibrator, this type of electrical connection may be subject to extreme stress which can cause it to deteriorate or fail. Also, access to the surface to which the connection is to be made may be limited or difficult so that the connection cannot be made easily.

DISCLOSURE OF THE INVENTION

An object of the present invention is to provide a piezoelectric device with an improved form of electrical connection to the surface of the piezoelectric element.

This is achieved according to the invention by providing a piezoelectric element with an electrically conductive surface and an electrical terminal spaced from said surface with a resilient, compressible mass of electrically conductive material held captive between said terminal and said surface to form an electrical connection therebetween.

Preferably, said electrically conductive material comprises filaments having at least a conductive surface layer and which are resilient in bending so that when compressed they tend to expand and maintain continuous physical end electrical contact with the adjacent conductive surfaces. The low inertia of the resilient filaments and their multiple contact with the adjacent surfaces also helps provide the required continuous contact. Thus, the use of a conventional soldered connection to the piezoelectrical element and the associated stress related mechanical failure problems or physical access problems are avoided.

In a preferred form of piezoelectric vibrator for undersea use, the electrically conductive material comprises brass wire wool compressed to a density to give the required continuous contact with the conductive surfaces of the piezoelectric element and terminal.

DESCRIPTION OF THE DRAWING

The invention will now be described by way of example with reference to the accompanying drawing which shows a piezoelectric vibrator for undersea use.

MODE OF CARRYING OUT THE INVENTION

The vibrator comprises a rod-shaped electrically conducting core 1 surrounded by a cylindrical sleeve 2 of a piezoelectric ceramic material with silvered inner and outer surfaces. An annular end plate 3 of electrically insulating material is seated in each open end of the sleeve 2 and secured thereto by adhesive 4. Each end plate 3 seats at its inner periphery on the core 1 and is sealed thereto by an O-ring seal 5 located axially between the end plate 3 and a radially outwardly extending flange 6 at each end of the core 1. The core 1 is of two part construction, the two parts being joined by a central axial bolt 7 so as to clamp a central radially extending restraining plate 8 therebetween which divides the interspace between the core 1 and sleeve 2 into two chambers. As shown in the drawing, the left hand chamber is packed with brass wire wool 9. The restraining plate 8 serves to hold the brass wire tool 9 captive while the core 1 is assembled within the sleeve 2.

An alternating voltage signal is applied between the inner and outer surfaces of the sleeve 2 which causes the latter to oscillate radially at the applied signal frequency, thereby causing it to emit compression waves in the surrounding medium. In use, the vibrator illustrated is typically located in an oil-filled housing which is immersed in the sea to generate compression waves in the seawater.

The alternating voltage signal may be generated by a known power supply (not shown) connected to the core 1 and sleeve 2 via connections 10 and 11, respectively. The connection 10 is conveniently connected to an end face of the core via a soldered connection 12 or any other kind of electrical connector. The connection 11 to the sleeve 2 is connected to the outer surface of the sleeve via a soldered connection 13 or any other kind of electrical connection such as a mechanical clip. It will be appreciated that these soldered connections 12, 13 can be made fairly readily and reliably so that they do not suffer any adverse effects due to vibration of the vibrator during operation. The brass wire wool 9 forms the electrical connection between the core 1 and inner surface of the sleeve 2 and avoids the problems associated with making a conventional connection such as a soldered connection to this inner surface.

The brass wire wool 9 must be selected to have suitable properties for the function required of it, and in particular, it must be sufficiently resilient and compliant, and be free of any conductive particulate material. Typically, the brass wire wool used is a proprietary grade 3 as supplied by The Metallic Wool Company.

In an alternative embodiment of the invention, the brass wire wool 9 may be replaced by other electrically conductive filament material or filament material coated with or otherwise having a surface layer of electrically conductive material.

It will be appreciated that whilst the invention has been illustrated and described in connection with a piezoelectric vibrator, it can also be applied to a piezoelectric transducer in which mechanical vibrations of the piezoelectric element generate an alternating voltage signal therein which is used as an indication of mechanical energy, such as compression waves, incident on the transducer.

I claim:

1. A piezoelectric device comprising a piezoelectric element supported so that it is mechanically coupled to an external vibration transmitting environment, and electrical connection means for connecting the piezoelectric element to electrical generator means, said connection means comprising a compressible mass of resilient filaments having at least a conductive surface layer, said mass being held captive between an electrically conductive surface of the piezoelectric element and a terminal of the generator means so as to conform to varying spacing between said surface and said terminal as said surface vibrates, in which the piezoelectric element comprises an annular member with said mass of resilient filaments located within it to make an electrical connection to an inner annular surface thereof, and in which the terminal comprises a central member within the annular piezoelectric member with the mass of resilient filaments held captive in an annular space therebetween and end members closing the space at both ends of the device.

2. A device as claimed in claim 1 in which said mass of resilient filaments comprises wire wool.

3. A device as claimed in claim 2 in which said mass of resilient filaments comprises brass wire wool.

4. A device as claimed in claim 1 in which the central member comprises two parts assembled together end-to-end which each form a respective end member.

5. A device as claimed in claim 4 in which a second electrical terminal is connected to the outer surface of the piezoelectric element.

6. A device as claimed in claim 1, in the form of a vibrator in which said electric generator means applies an alternating voltage signal across connection means to make said vibrator vibrate.

* * * * *